(12) United States Patent
Tanaka et al.

(10) Patent No.: US 12,288,777 B2
(45) Date of Patent: Apr. 29, 2025

(54) DISPLAY DEVICE

(71) Applicant: Japan Display Inc., Tokyo (JP)

(72) Inventors: Yoshinori Tanaka, Tokyo (JP); Jin Hirosawa, Tokyo (JP); Masanobu Ikeda, Tokyo (JP)

(73) Assignee: JAPAN DISPLAY INC., Tokyo (JP)

( * ) Notice: Subject to any disclaimer, the term of this patent is extended or adjusted under 35 U.S.C. 154(b) by 476 days.

(21) Appl. No.: 17/861,264

(22) Filed: Jul. 11, 2022

(65) Prior Publication Data

US 2023/0022736 A1 Jan. 26, 2023

(30) Foreign Application Priority Data

Jul. 12, 2021 (JP) .................................. 2021-115308

(51) Int. Cl.
| | |
|---|---|
| *H01L 25/16* | (2023.01) |
| *H01L 27/12* | (2006.01) |
| *H01L 33/60* | (2010.01) |
| *H01L 23/00* | (2006.01) |
| *H01L 33/32* | (2010.01) |

(52) U.S. Cl.
CPC .......... *H01L 25/167* (2013.01); *H01L 27/124* (2013.01); *H01L 33/60* (2013.01); *H01L 24/05* (2013.01); *H01L 24/08* (2013.01); *H01L 33/32* (2013.01); *H01L 2224/05073* (2013.01); *H01L 2224/05082* (2013.01); *H01L 2224/05124* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/08145* (2013.01)

(58) Field of Classification Search
CPC . H01L 25/167; H01L 27/1225; H01L 27/124; H01L 33/60
See application file for complete search history.

(56) References Cited

U.S. PATENT DOCUMENTS

| | | | | |
|---|---|---|---|---|
| 2005/0127485 | A1* | 6/2005 | Shei | ........................ H01L 33/60 |
| | | | | 257/E33.072 |
| 2016/0359142 | A1* | 12/2016 | Huangfu | ................ H10K 59/00 |
| 2021/0225968 | A1* | 7/2021 | Huangfu | ............. H10K 50/813 |
| 2021/0265533 | A1 | 8/2021 | Itou et al. | |
| 2021/0335939 | A1* | 10/2021 | Li | ........................ H10K 59/878 |
| 2021/0359046 | A1* | 11/2021 | Wang | .................... H10K 59/124 |

FOREIGN PATENT DOCUMENTS

JP            2020-80356 A         5/2020

* cited by examiner

*Primary Examiner* — Tracie Y Green
(74) *Attorney, Agent, or Firm* — XSENSUS LLP

(57) ABSTRACT

A display device includes a first planarization film including an opening, a reflective film provided on an inclined surface inside the opening in the first planarization film, an LED chip surrounded by the reflective film and provided inside the opening, and a second planarization film provided on the first planarization film, surrounding the LED chip, and filling the opening, wherein a height from an upper end of the inclined surface of the first planarization film to an interface with air in the second planarization film is 20 μm or less.

20 Claims, 13 Drawing Sheets

DISPLAY DEVICE

CROSS-REFERENCE TO RELATED APPLICATIONS

This application claims the benefit of priority to Japanese Patent Application No. 2021-115308, filed on Jul. 12, 2021, the entire contents of which are incorporated herein by reference.

FIELD

One embodiment of the invention relates to a display device with LEDs.

BACKGROUND

Recently, a display device has been developed for a pixel with a small LED chip in which the size of one LED is less than 1 mm (micron order). An LED display device with a cavity structure has been proposed to improve optical extraction efficiency. The cavity structure is a structure in which a reflective structure is arranged around the LED chip.

Japanese Patent Laid-Open No. 2020-080356 discloses an LED display device having a cavity structure. The cavity structure enhances the optical extraction efficiency because light emitted from the LED chip is reflected by a reflective structure provided around the LED chip.

SUMMARY

A display device according to one embodiment of the present application includes a first planarization film including an opening, a reflective film provided on an inclined surface inside the opening in the first planarization film, an LED chip surrounded by the reflective film and provided inside the opening, and a second planarization film provided on the first planarization film, surrounding the LED chip, and filling the opening, wherein a height from an upper end of the inclined surface of the first planarization film to an interface with air in the second planarization film is 20 μm or less.

A display device according to one embodiment of the present application includes a first planarization film including an opening, a reflective film provided on an inclined surface inside the opening in the first planarization film, an LED chip surrounded by the reflective film and provided inside the opening, a second planarization film provided on the first planarization film, surrounding the LED chip, and filling the opening, and a substrate provided on the second planarization film, wherein a height from an upper end of the inclined surface of the first planarization film to the interface between the substrate and air is 20 μm or less.

DESCRIPTION OF EMBODIMENTS

Figure 1:
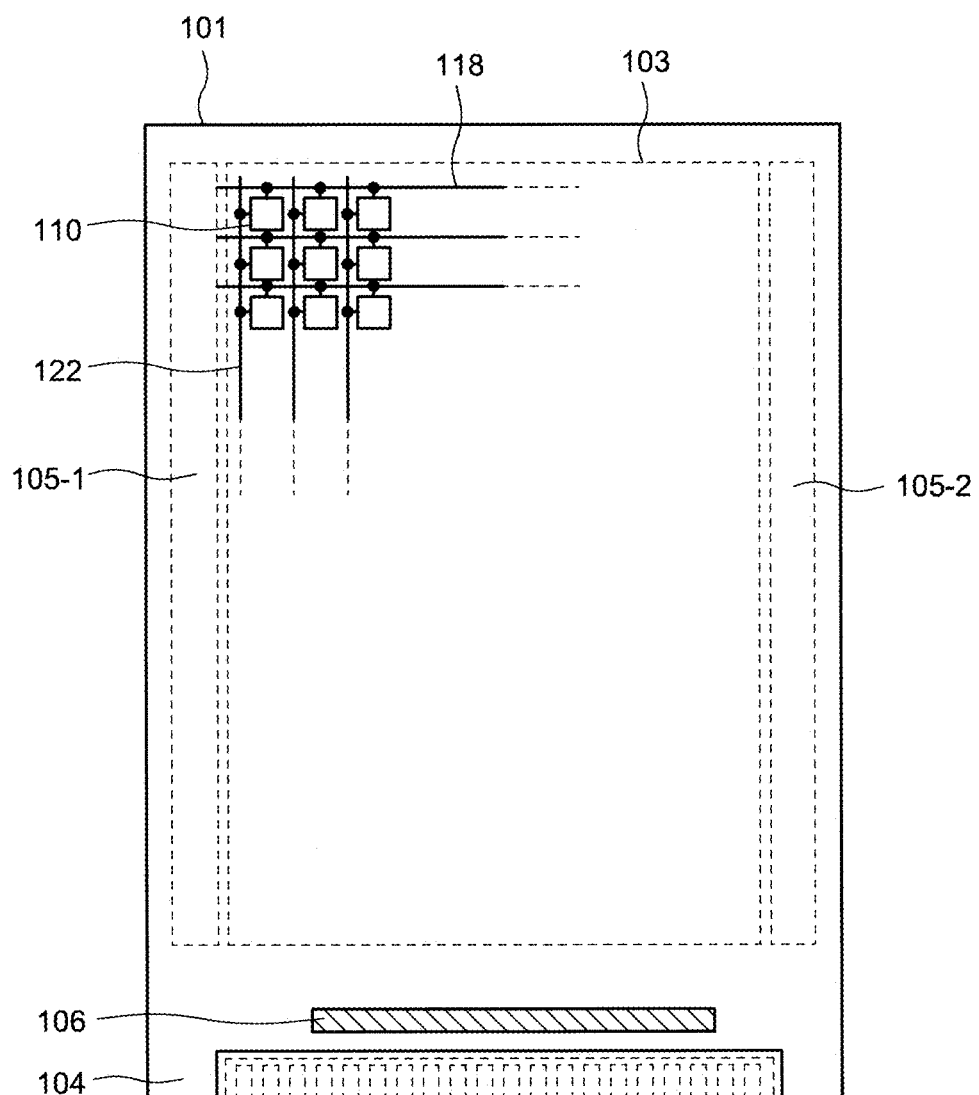
FIG. 1 is a plan view illustrating a schematic structure of a display device according to one embodiment of the present invention.

Even in a micro-LED display device having a cavity structure, a thickness of a planarization film and a cover glass on an LED chip is thick, resulting in components that are totally reflected at an interface between the cover glass and an air layer. Therefore, even when adopting a cavity structure, loss is generated when light is extracted to the outside of the display device, causing a decrease in luminous efficiency and brightness.

The display device according to one embodiment of the present invention can improve luminous efficiency.

Embodiments of the present invention will be described below with reference to the drawings and the like. However, the present invention can be implemented in many different modes, and should not be construed as being limited to the description of the following embodiments. In addition, although the drawings may schematically represent the width, thickness, shape, and the like of each portion as compared with actual embodiments for the sake of clarity of description, the drawings are merely an example and do not limit the interpretation of the present invention. In this specification and each drawing, the same reference numerals are assigned to the same elements as those described previously with reference to the preceding drawings, and a detailed description thereof may be omitted as appropriate.

First Embodiment

A structure of a display device 100 according to one embodiment of the present invention will be described with reference to FIG. 1 to FIG. 5.

<Schematic Structure of Display Device>

FIG. 1 is a plan view illustrating a schematic structure of the display device 100 according to one embodiment of the present invention. The display device 100 has a substrate 101, a pixel 110, driver circuits 105-1, 105-2, a driver IC 106, and a terminal part 107.

As shown in FIG. 1, the display device 100 includes a display region 103 and a peripheral region 104. The display region 103 is a region for displaying an image. The peripheral region 104 is a region that does not overlap the display region 103 and is arranged outside the display region 103.

The display region 103 includes a plurality of pixels 110. The plurality of pixels 110 is arranged in a matrix in a first direction D1 and a second direction D2. The first direction D1 and the second direction D2 are parallel to the surface of the substrate 101. Although FIG. 1 shows a state where the first direction D1 is perpendicular to the second direction D2, the first direction D1 may intersect the second direction D2. A third direction D3 is a direction perpendicular to the first direction D1 and the second direction D2. Also, a plan view refers to a positional relationship when viewed from the third direction D3.

The pixel 110 is connected to a gate line 118 arranged along the first direction D1 and a source line 122 arranged along the second direction D2. The pixel 110 includes a driving transistor and an LED chip. Light emission of the LED chip is controlled by controlling the driving transistor using a gate voltage supplied to the gate line 118 and a video signal supplied to the source line 122.

The driver circuits 105-1, 105-2, the driver IC 106, and the terminal part 107 are provided on the peripheral region. The terminal part 107 is provided along the first direction D1 in the peripheral region 104. The terminal part 107 has a plurality of terminals. The plurality of terminals is connected to an FPC 108. Various control signals are supplied to the plurality of terminals by the FPC 108. The driver IC 106 supplies various control signals to the driver circuits 105-1, 105-2 and the plurality of pixels 110. The driver circuits 105-1, 105-2 are circuits that drive a plurality of gate lines 118 based on various control signals from the driver IC 106. The driver circuits 105-1, 105-2 sequentially or simultaneously select the plurality of gate lines 118 to supply a gate voltage to the selected gate line 118.

Figure 2:
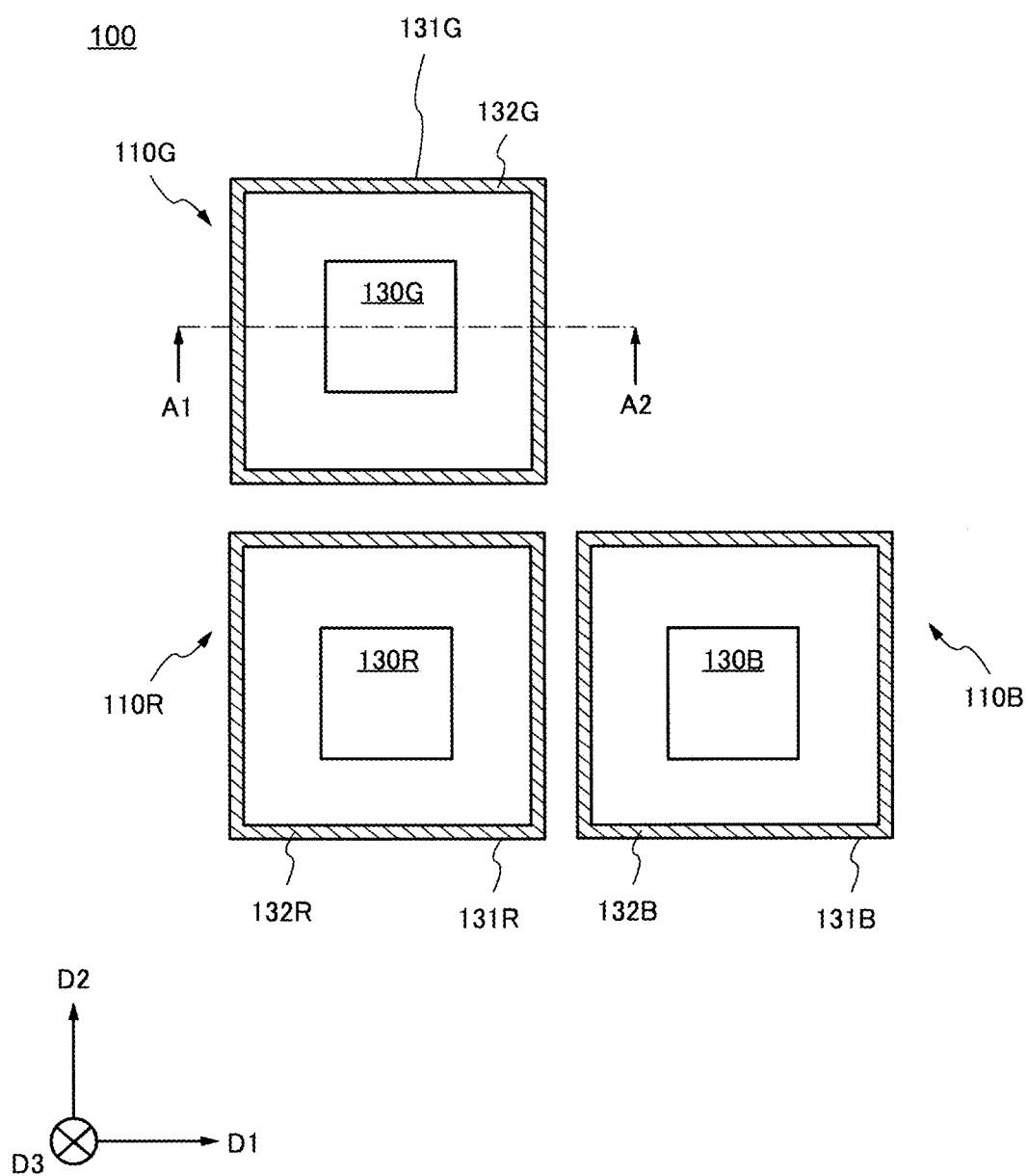
FIG. 2 is a plan view showing a plurality of pixels.
Figure 3:
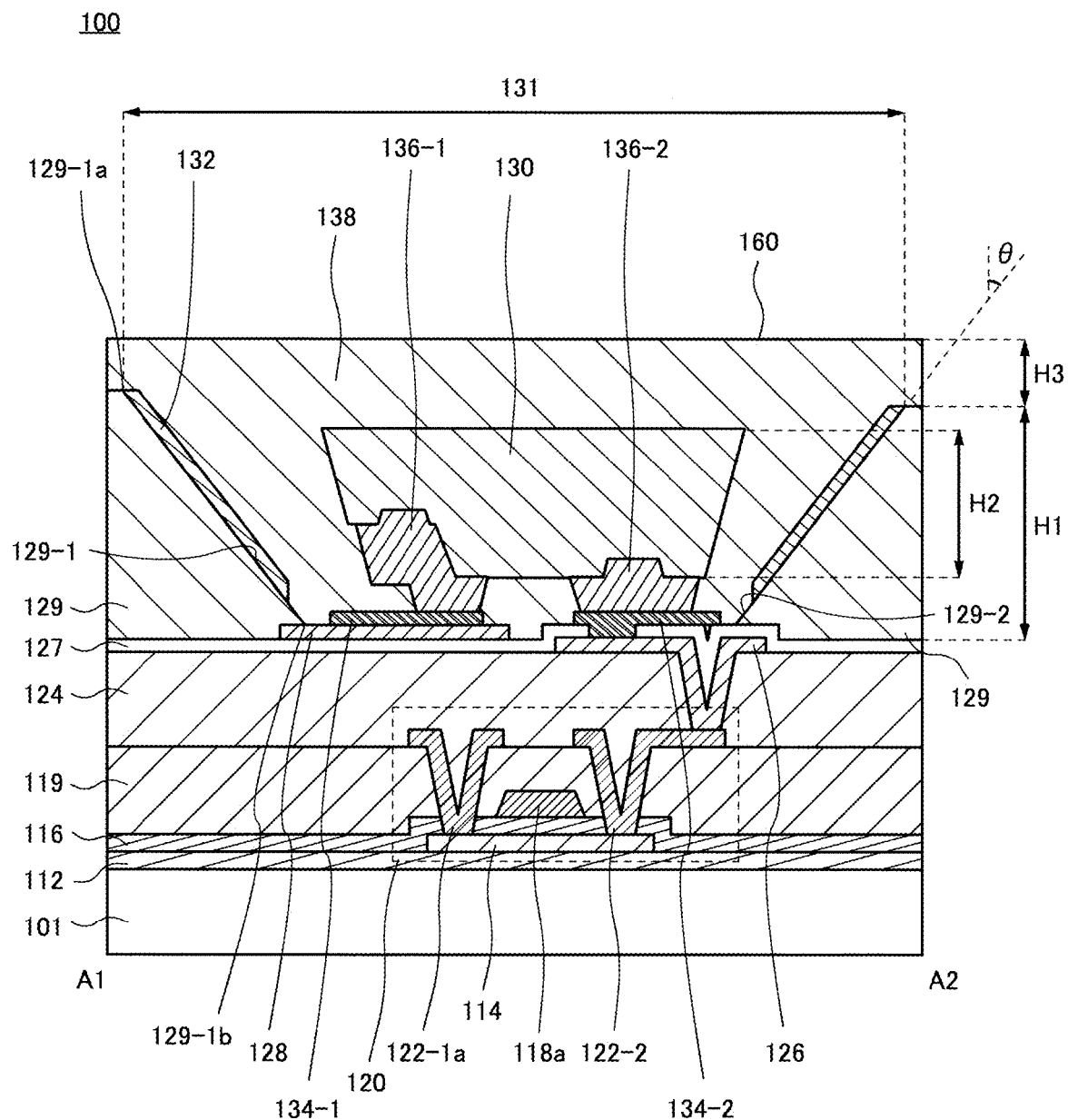
FIG. 3 is a cross-sectional view of a pixel shown in FIG. 2 taken along a line A1-A2.

FIG. 2 is a plan view showing the plurality of pixels 110 arranged in the display region 103. FIG. 3 is a cross-sectional view of the pixel 110 (pixel 110G) taken along a line A1-A2. As shown in FIG. 2, a pixel 110R includes an LED chip 130R and emits red as a first color. A pixel 110G includes an LED chip 130G and emits green as a second color. A pixel 110B includes an LED chip 130B and emits blue as a third color. In FIG. 2, an example in which the pixel 110R and the pixel 110B are arranged along the first direction D1, and the pixel 110R and the pixel 110G are arranged along the second direction D2 is shown. The first color, the second color, and the third color are not limited to red, green, and blue, and any color such as a complementary color may be selected. Also, notations R, G, and B in FIG. 2 denote red, green, and blue pixels, respectively, and components of the pixels are denoted by the same notation.

In addition, a planarization film is provided on an insulating surface. FIG. 2 shows openings 131R, 131G, and 131B provided in the planarization film. Reflective films 132R, 132G, and 132B are provided on each inclined surface of the openings 131R, 131G, and 1316. LED chips 130R, 130G, and 130B are provided inside the openings 131R, 131G, and 131B. In the following description, when it is not necessary to distinguish the pixels 110R, 110G, and 110B, the pixels 110R, 110G, and 1106 are simply referred to as the pixels 110. In addition, the same applies to the components of the pixel 110.

As shown in FIG. 3, the LED chip 130 is provided above the substrate 101. The substrate 101 is an insulating substrate, and is made of, for example, a glass substrate, a resin substrate, a resin film, or the like. In this specification and the like, a direction from the substrate 101 toward the LED chip 130 in the third direction D3 perpendicular to the surface of the substrate 101 is referred to as "upper side".

A transistor 120 is provided on the substrate 101 via an undercoat film 112. The undercoat film 112 is formed by, for example, a single layer or a stacked layer of silicon oxide and silicon nitride. The transistor 120 functions as a driving transistor for the LED chip 130. In the present embodiment, although the transistor 120 is shown as a top gate structure, the transistor 120 may also be a bottom gate structure or a dual gate structure. The transistor 120 includes at least a semiconductor layer 114, a gate insulating film 116, and a gate electrode 118a.

For example, amorphous silicon, polysilicon, or an oxide semiconductor is used as the semiconductor layer 114. Oxide semiconductors include, for example, IGZO (Indium Gallium Zinc Oxide), ITZO (Indium Tin Zinc Oxide), ZnON (Zinc Oxide Nitride), IGO (Indium Gallium Oxide), and the like. For example, a single layer or a stacked layer of silicon oxide and silicon nitride is used as the gate insulating film 116. The gate electrode 118a is provided on the semiconductor layer 114 via the gate insulating film 116. The gate electrode 118a is electrically connected to the gate line 118. The gate electrode 118a may be formed of the same conductive layer as the gate line 118 or a different conductive layer.

An interlayer insulating film 119 is provided on the gate electrode 118a. A source electrode 122-1a and a drain electrode 122-2 are provided on the interlayer insulating film 119. The source electrode 122-1a and the drain electrode 122-2 are electrically connected to the semiconductor layer 114 via a contact hole provided in the interlayer insulating film 119. A planarization film 124 is provided on the source electrode 122-1a and the drain electrode 122-2. An organic resin such as polyimide, acrylic, or epoxy is used as the planarization film 124. An electrode 126 is provided on the planarization film 124. The electrode 126 is electrically connected to the drain electrode 122-2 via a contact hole formed in the planarization film 124. The electrode 126 functions as a pixel electrode. An insulating film 127 is provided on the planarization film 124 and the electrode 126. For example, silicon oxide or silicon nitride is provided in a single layer or a stacked layer as the insulating film 127. An electrode 128 is provided on the insulating film 127. The electrode 128 functions as a common electrode.

A planarization film 129 is provided on the insulating film 127 and the electrode 128. The planarization film 129 covers an end of the electrode 128. The planarization film 129 is provided with an opening 131 (also referred to as a cavity). The opening 131 is a region on which the LED chip 130 is provided later. A thickness (height H1) of the planarization film 129 is set to be at least higher than a height (H2) of the LED chip 130. In this case, the thickness of the planarization film 129 is a thickness from a surface (bottom surface) in contact with the insulating film 127 to a surface of the planarization film 129. When the pixel 110 is viewed in a plan view, the opening 131 has a square shape. The opening 131 specifically has the shape of a truncated square pyramid in which the area of the surface of the planarization film 129 is larger than the area of a square on the bottom surface side of the planarization film 129. In the present embodiment, the shape of the opening 131 will be described as a truncated square pyramid shape. In FIG. 3, the opening 131 has inclined surfaces 129-1, 129-2. The inclined surfaces 129-1, 129-2 are inclined at an angle θ with respect to the third direction D3 perpendicular to the horizontal plane of the substrate 101 and a substrate 102 (the first direction D1 and the second direction D).

The reflective film 132 is provided on the planarization film 129 inside the opening 131. The reflective film 132 is provided along the inclined surfaces 129-1, 129-2 inside the opening 131 in the planarization film 129. The reflective film 132 is also provided on inclined surfaces adjacent to the inclined surface 129-1 and the inclined surface 129-2 of the planarization film 129 in the same manner as the inclined surfaces 129-1, 129-2. That is, the reflective film 132 is provided over the entire inclined surface inside the opening 131 when viewed in a plan view. In the reflective film 132, an upper end of the reflective film 132 is provided on an upper end 129-1a of the upper surface side of the opening 131 in the planarization film 129, and a bottom end of the planarization film 129 is provided on a bottom end 129-1b on the bottom surface side of the planarization film. In this case, the bottom end on the bottom surface side of the planarization film 129 is a portion in contact with the electrode 128. The reflective film 132 is not provided on the surface (upper surface) of the planarization film 129. In other words, the reflective film 132 is located on the upper end 129-1a side of the inclined surface 129-1 inside the planarization film 129, and the inclined surface 129-1 of the planarization film 129 is exposed from the reflective film 132 at the bottom end 129-1b of the inclined surface 129-1 in the planarization film 129. The reflective film 132 may be, for example, a metal having a reflective property. For example, aluminum is used as the reflective film 132. In the present embodiment, in a plan view, the reflective film 132 is provided over the entire upper end 129-1a side of the inclined surface 129-1 of the opening 131. The reflective film 132 in a cross-sectional view is not formed on the bottom end 129-1b side of the opening 131. Therefore, the reflective film 132 is electrically insulated from the electrode 128.

Inside the opening 131, an electrode 134-1 is provided on the electrode 128. An electrode 134-2 is provided on the insulating film 127. The electrode 134-2 is electrically connected to the electrode 126 via a contact hole provided in the insulating film 127. The electrodes 134-1, 134-2 are electrodes for electrically connecting the LED chip 130. In the present embodiment, the electrodes 134-1, 134-2 are provided so as to be electrically insulated from the reflective film 132.

The LED chip 130 is surrounded by the reflective film 132 and provided inside the opening. In addition, the LED chip 130 is provided on the electrode 134-1 and the electrode 134-2. The LED chip 130 is electrically connected to the electrode 134-1 via an electrode 136-1 and is electrically connected to the electrode 134-2 via an electrode 136-2. The electrodes 136-1, 136-2 are formed of a conductive material such as gold (Au), copper (Cu), silver (Ag), tin (Sn), or aluminum (Al). A micro-LED or mini-LED is used as the LED chip 130. The micro-LED is an LED with a size of 100 μm or less, and the mini-LED is an LED with a size of 100 μm to 200 μm. In the display device 100, any sized LED may be used as long as it is appropriately used according to the size of the pixel 110. The side surface of the LED chip 130 faces the inclined surfaces 129-1, 129-2 of the planarization film 129 and the reflective film 132.

Figure 4:
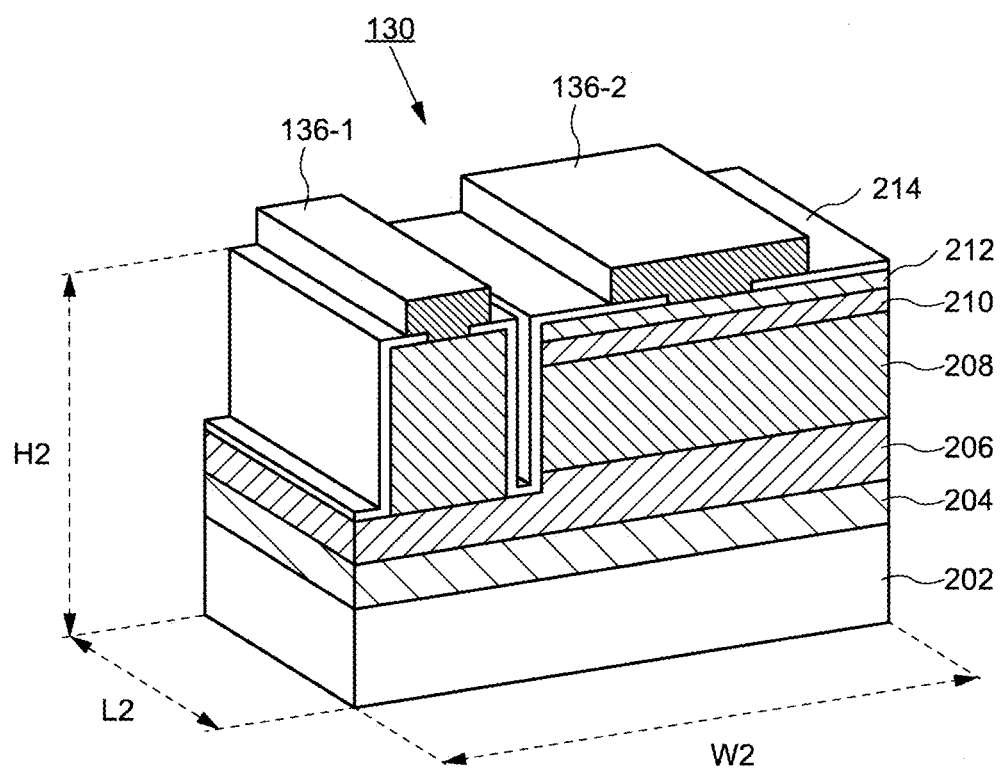
FIG. 4 is a perspective view illustrating a structure of a LED chip.

FIG. 4 shows an example of the structure of an LED wafer constituting the LED chip 130. The LED chip 130 has a structure in which a buffer layer 204 formed of gallium nitride or the like is formed on a substrate using a semiconductor wafer such as GaAs or on a substrate 202 formed of an insulating material such as sapphire or the like, an is provided with n-type layer 206 formed of a gallium nitride-based compound semiconductor, an active layer 208 in which a quantum well structure is formed of a gallium nitride-based compound semiconductor, a p-type layer 210 formed of a gallium nitride-based compound semiconductor, a passivation layer 214, the electrodes 136-1, and the electrodes 136-2. However, when the LED chip 130 is mounted on the electrodes 134-1, 134-2, the substrate 202 of the LED chip 130 is removed. In the present embodiment, the size of the LED chip 130 is called a so-called micro-LED, and has, for example, a vertical width L2 of 10 μm to 150 μm, a horizontal width W2 of 5 μm to 100 μm, and a height H2 of 5 μm to 15 μm.

A planarization film 138 is provided on the planarization film 129 so as to cover the LED chip 130 and embed the opening 131. The planarization film 138 has a function as a protective film for protecting the LED chip 130, and also has a function as a planarization film for flattening a step caused by the LED chip 130.

The planarization film 138 is formed of, for example, a resin such as acrylic, and is applied by, for example, a slit-coating method after mounting of the LED chip 130. For example, in the case where the substrate 101 is a resin substrate having flexibility, a cover glass is not intentionally provided to realize the flexible display device 100, and a structure in which the substrate 101 including the LED chip 130 is protected by the planarization film 138 may be preferable in some cases.

The LED chip 130 emits light from the active layer 208 when a voltage greater than or equal to the emission threshold is applied between the electrode 126 and the electrode 128. The emitted light passes through the planarization film 138 and the substrate 102 and is emitted to the outside. The light emitted from the LED chip 130 has weak directionality and is emitted not only to the front (the third direction D3 shown in FIG. 3) but also in a transverse direction with a wide solid angle.

In a micro-LED display device having a conventional cavity structure, among the light emitted from the LED, there is a component that is totally reflected at the interface between the cover glass and the air layer. The totally reflected light is confined by multiple reflections in the medium (here, organic resins or glasses), and the light is attenuated in the medium without being extracted to the exterior of the display device. Therefore, loss is generated when the light is extracted to the exterior of the display device. This leads to a decrease in the luminous efficiency and brightness of the display device.

Therefore, in the display device 100 according to one embodiment of the present invention, a height H3 from the upper end 129-1a of the opening 131 to an interface 160 with the air is reduced. Specifically, the height H3 from the upper end 129-1a of the opening 131 to the interface with the air 160 is set to 20 μm or less. In this case, the height H3 of the interface with the air 160 from the upper end 129-1a of the opening 131 refers to a height (thickness) from an upper end (surface) of the inclined surface of the planarization film 129 to the surface of the planarization film 138. Also, the smaller the height H3, the better, and the height H3 may be 0 μm.

Figure 5:
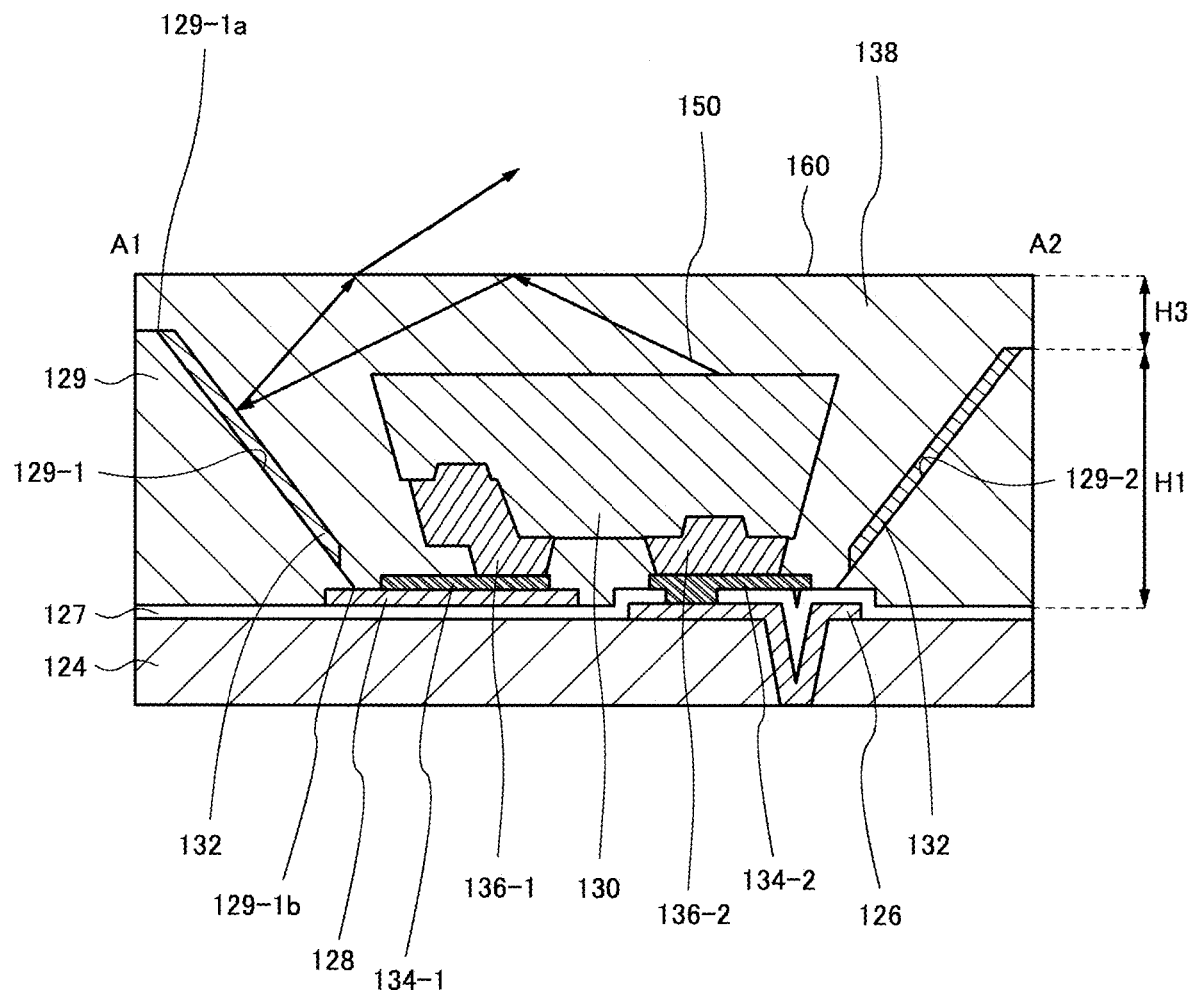
FIG. 5 is a diagram showing how light retracts in the pixel structure shown in FIG. 3.

FIG. 5 is a diagram showing a state in which light is refracted in the pixel structure shown in FIG. 3. In FIG. 5, the layers below the planarization film 124 are omitted. In the present embodiment, the height H3 from the upper end 129-1a of the opening 131 to the interface with the air 160 is reduced. As a result, as shown in FIG. 5, even if the light emitted from the LED chip 130 is totally reflected by the planarization film 138, the light is reflected by the reflective film 132 in a direction which does not satisfy a total reflection condition, passes through the planarization film 138, and can be extracted to the exterior. Therefore, it is possible to suppress the light emitted from the LED chip 130 from being lost by the total reflection. Therefore, it is possible to improve the luminous efficiency and brightness of the display device 100.

At this time, angles θ of the inclined surfaces 129-1, 129-2 of the planarization film 129 are preferably 15° or more and 50° or less. When the angles θ of the inclined surfaces 129-1, 129-2 of the planarization film 129 are within the range described above, the luminous efficacy and brightness of the display device 100 can be further improved.

<Modification 1>

Figure 6:
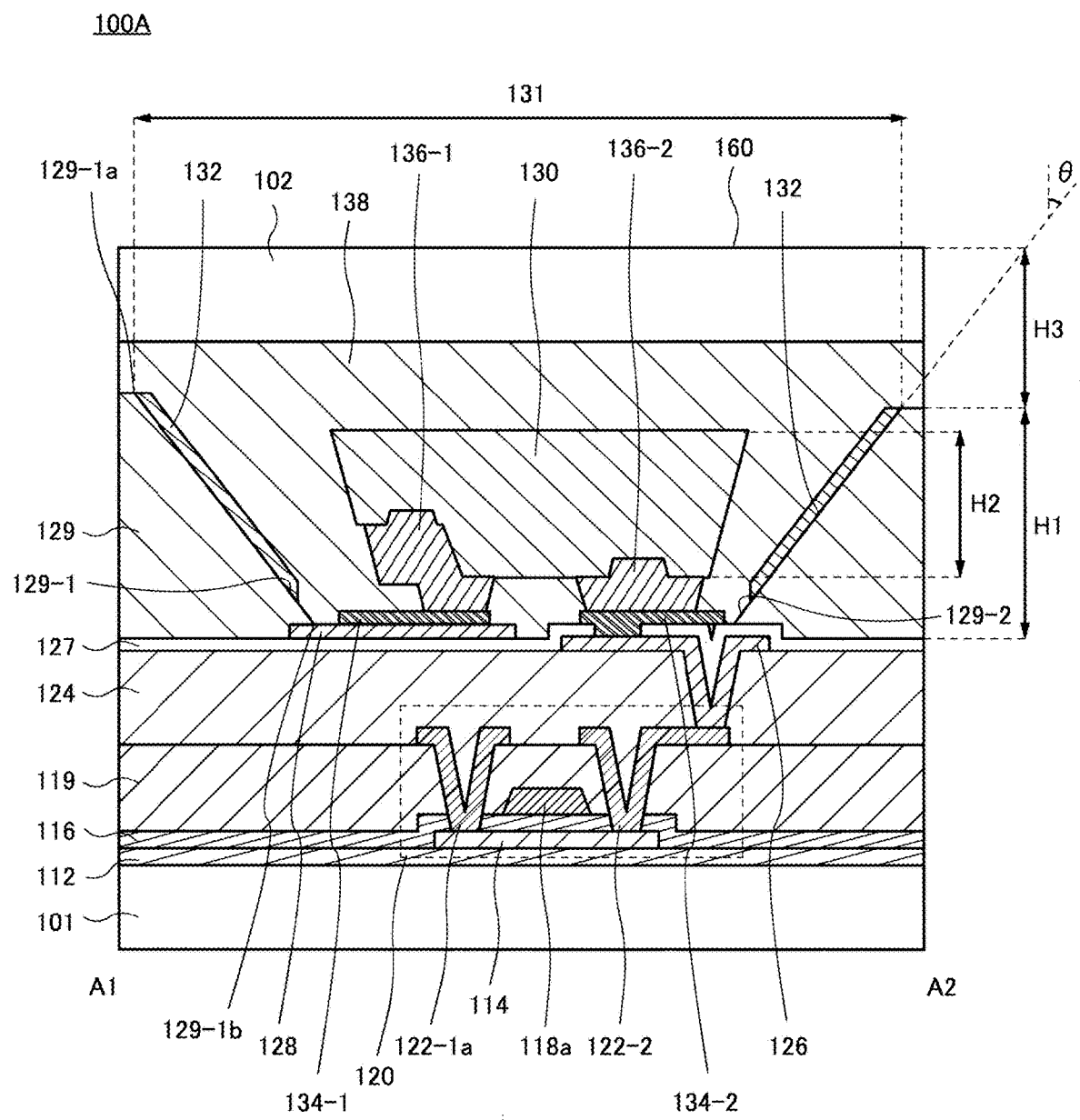
FIG. 6 is a cross-sectional view of a pixel structure of a display device according to one embodiment of the present application.

FIG. 6 shows a pixel structure of a display device 100A according to one embodiment of the present invention. In FIG. 6, the structure is the same as that of the display device 100 except that the substrate 102 is provided as a cover glass on the planarization film 138.

The planarization film 138 and the substrate 102 are provided on the opening 131. The planarization film 138 is provided on the surface of the planarization film 129 as well as filling the opening 131. The substrate 102 functions as a cover glass. Materials similar to those of the substrate 101 may be used as the substrate 102. The substrate 102 is an insulating substrate, and is made of, for example, a glass substrate, a resin substrate, a resin film, or the like.

The planarization film 138 functions as a protective film to protect the LED chip 130. In addition, the planarization film 138 has a function as an adhesive layer for bonding with the substrate 102. The planarization film 138 also functions as a planarization film for flattening the step caused by the LED chip 130 when the substrate 102 is bonded.

The planarization film 138 is formed of a resin such as acrylic. The planarization film 138 is applied after mounting of the LED chip 130, for example, by a slit-coating method. After applying the planarization film 138, a cover glass is attached and UV-cured to bond the film.

The height H3 from the upper end 129-1a of the opening 131 to the interface with the air 160 is also reduced in the display device 100A. Specifically, the height H3 from the upper end 129-1a of the opening 131 to the interface 160 with the air is set to 20 μm or less. In this case, the height H3 of the interface 160 with the air from the upper end 129-1a of the opening 131 refers to a height from the upper end (surface) of the inclined surface of the planarization film 129 to the surface of the substrate 102. In this case, the height H3 may or may not include a thickness of the planarization film 138. Also, the smaller the height H3, the better, and the height H3 may be 0 μm. In the case where a glass is used as the substrate 102, the refractive index of the glass is, for example, 1.4 to 1.6. Since the refractive index of the planarization film 138 is the same as the refractive index of the glass, the height H3 is treated as the height from the upper end 129-1a of the opening 131 to the interface 160 with the air.

Figure 7:
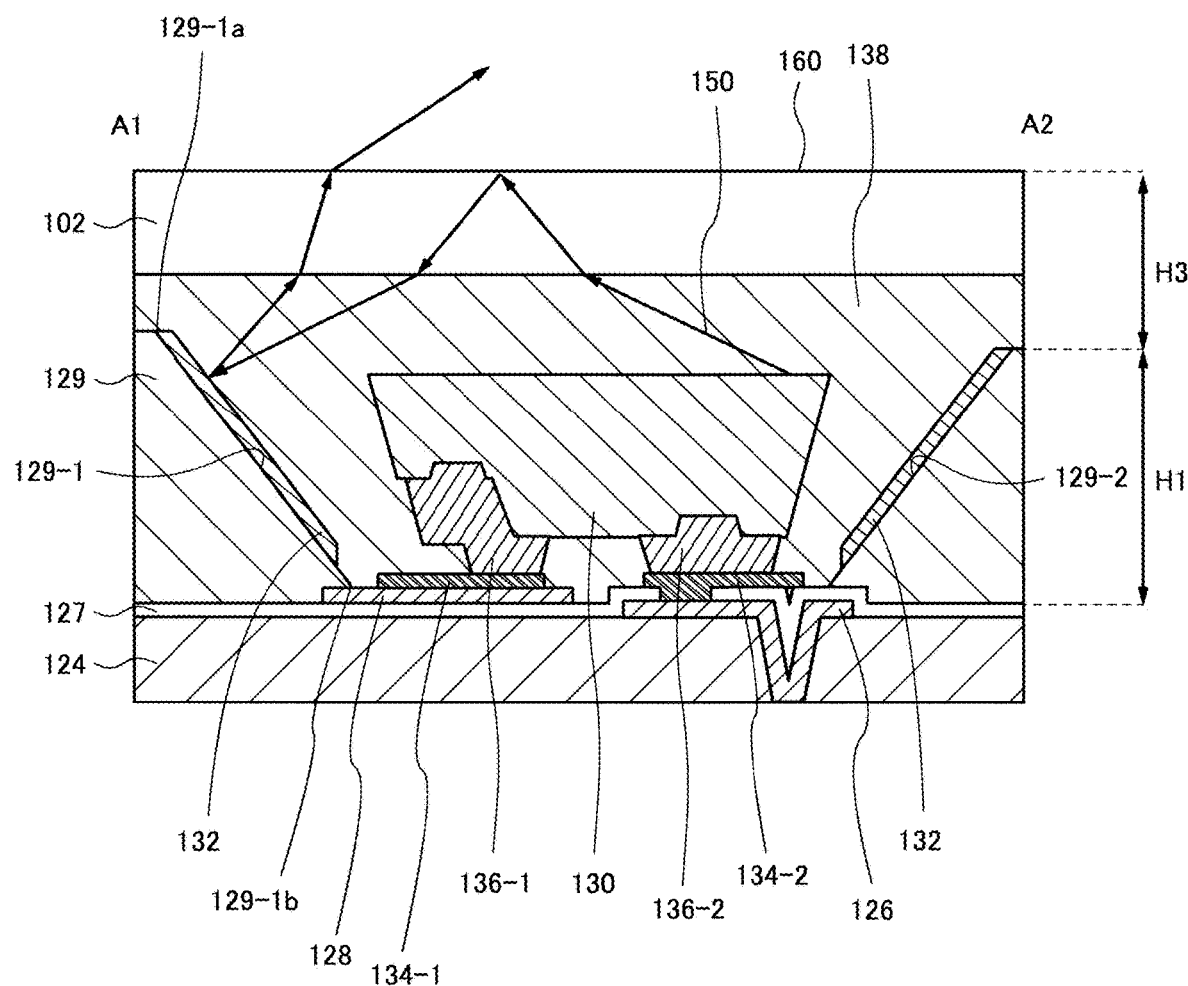
FIG. 7 is a diagram showing how light refracts in the pixel structure shown in FIG. 6.
Figure 7:
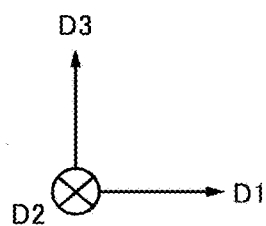

FIG. 7 is a diagram showing how light reflects in the pixel structure of the display device 100A shown in FIG. 6. In FIG. 7, the layers below the planarization film 124 are omitted. In the present embodiment, the height H3 from the upper end 129-1a of the opening 131 to the interface 160 with the air is reduced. Even if the refractive index of the planarization film 138 and the refractive index of the substrate 102 are substantially the same, in the light emitted from the LED chip 130, a component that is totally reflected at the interface between the planarization film 138 and the substrate 102 may be produced. As shown in FIG. 7, even if the light emitted from the LED chip 130 is totally reflected by the planarization film 138 and the substrate 102, the light is reflected by the reflective film 132 in a direction which does not satisfy the total reflection condition, passes through the planarization film 138 and the substrate 102, and can be extracted to the exterior. Therefore, it is possible to improve the luminous efficiency and brightness of the display device 100 because the light emitted from the LED chip 130 can be suppressed from being lost by the total reflection.

Second Embodiment

In the present embodiment, the structure of the reflective film 132 which is partially different from the pixel structure of the display device 100 in the first embodiment will be described with reference to FIG. 8. In the following description, points different from the first embodiment will be described.

Figure 8:
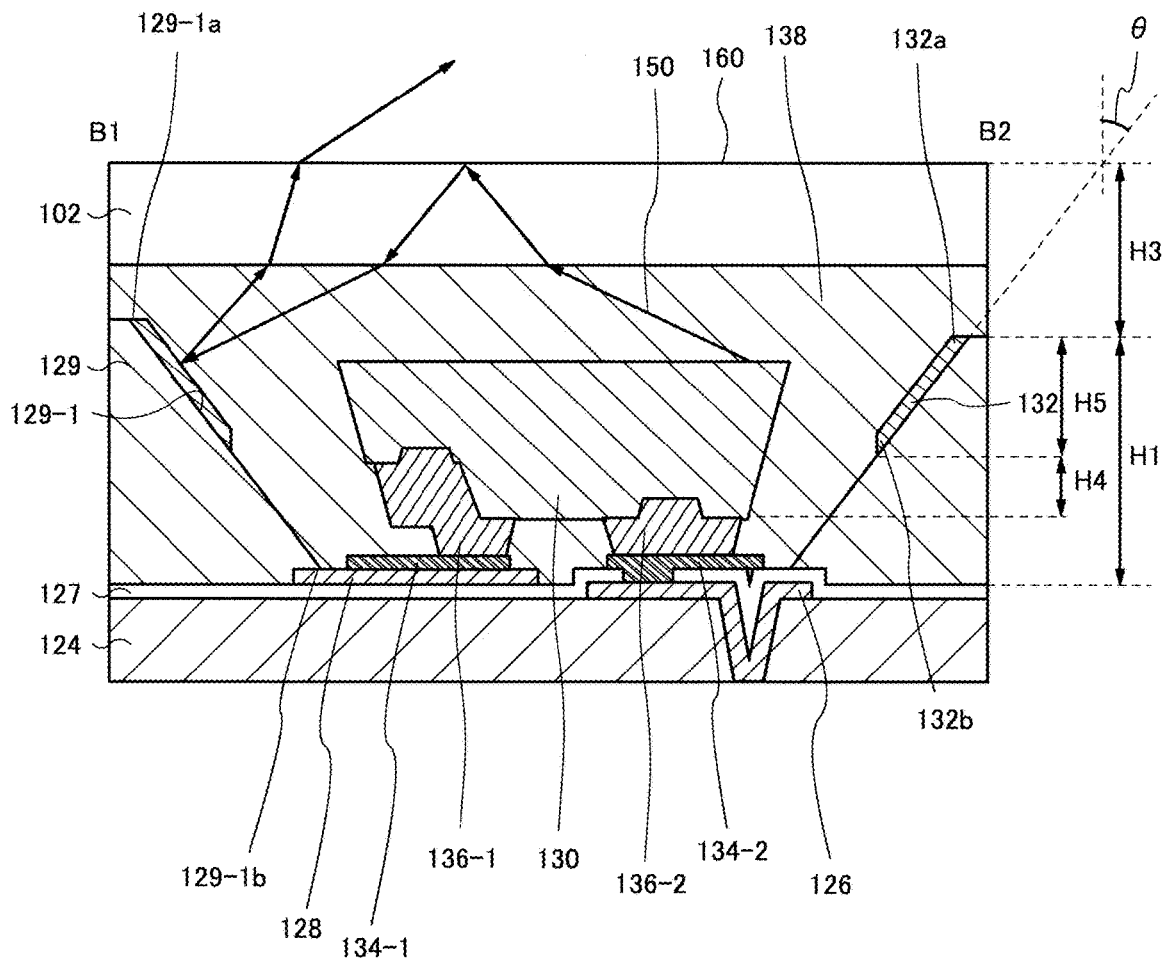
FIG. 8 is a cross-sectional view of a pixel structure of a display device according to one embodiment of the present application.
Figure 8:
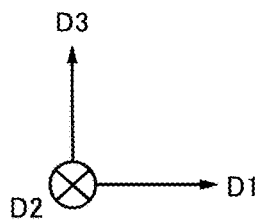

FIG. 8 is a cross-sectional view of a pixel structure of a display device 100B according to the present embodiment. In the present embodiment, a position at which the reflective film 132 is provided is different from that of the first embodiment. In the present embodiment, in the reflective film 132, the position of a bottom end 132b of the reflective film 132 is provided above the position of the bottom surface of the LED chip 130 on the inclined surface 129-1. The reflective film 132 is provided from a height H4 to the position of the upper end 129-1a of the planarization film 129 with reference to the bottom surface of the LED chip 130. That is, the height from the bottom surface of the LED chip 130 to the bottom end 132b of the reflective film 132 corresponds to the height H4. The height from the bottom end 132b to the upper end 132a of the reflective film 132 corresponds to a height H5 in the inclined surface 129-1. The position at which the upper end 132a of the reflective film 132 is provided substantially coincides with the position of the upper end 129-1a of the planarization film 129. In this specification and the like, "substantially coincides" refers to a range in which the position of the upper end 129-1a of the planarization film 129 is −10 nm or more and 10 nm or less with reference to the upper end 129-1a of the planarization film 129. In this case, the height H5 is obtained based on the angle θ at which the inclined surface 129-1 inclines when viewed in a cross section, and the length from the bottom end 132b to the upper end 132a of the reflective film 132 in the inclined surface 129-1. Although the reflection film 132 on the inclined surface 129-1 will be described as an example, the same applies to the reflection film 132 on the inclined surface 129-2. Also, in the case where the height H4 is 0 μm, that is, in the case where the position from the surface of the substrate 101 to the bottom surface of the LED chip 130 substantially coincides with the position from the surface of the substrate 101 to the bottom end 132b of the reflective film 132, or in the case where the position of the bottom end 132b of the reflective film 132 is lower than the position of the bottom surface of the LED chip, the pixel structure corresponds to the pixel structure of the first embodiment. As shown in FIG. 2, when viewed in a plan view, the reflective film 132 is provided over the entire inclined surface inside the opening 131. Also in FIG. 8, the reflective film 132 is not provided on the surface (upper surface) of the planarization film 129. In other words, the reflective film 132 is located on the upper end 129-1a side of the inclined surface 129-1 of the planarization film 129, and the inclined surface 129-1 of the planarization film 129 is exposed from the reflective film 132 at the bottom end 129-1b of the inclined surface 129-1 in the planarization film 129. In the present embodiment, although the reflective film 132 is provided over the entire upper end 129-1a side of the inclined surface 129-1 of the opening 131 in a plan view, it is not formed on the bottom end 129-1b side of opening 131 in a cross-sectional view. Therefore, the reflective film 132 is electrically insulated from the electrode 128.

The height H3 from the upper end 129-1a of the opening 131 to the interface 160 with the air is preferably 20 µm or less also in the pixel structure of the display device 100B shown in the present embodiment. In addition, the height H4 from the bottom surface of the LED chip 130 to the bottom end 132b of the reflective film 132 is preferably 0 µm or more and 20 µm or less. Further, the height H5 from the bottom end 132b of the reflective film 132 to the upper end 132a is preferably 5 µm or more and 40 µm or less. In this way, a thickness of the planarization film 129, a thickness of the planarization film 138, a thickness of the substrate 102, an inclination angle of the planarization film 129, and a region in which a reflective film 132 is provided are defined. As a result, even if the light emitted from the LED chip 130 is totally reflected by the substrate 102, the distance at which the light passes through the medium can be shortened. Therefore, it is possible to suppress the light emitted from the LED chip 130 from being lost by the total reflection. Therefore, it is possible to improve the luminous efficiency and brightness of the display device 100. Although FIG. 8 shows a structure in which the substrate 102 is provided on the planarization film 138, it is possible to have a structure in which the substrate 102 is not provided on the planarization film 138.

Third Embodiment

In the present embodiment, the structure of the reflective film 132 which is partially different from the pixel structure of the display device 100 according to the first embodiment will be described with reference to FIG. 9 and FIG. 10. In the following description, points different from the first and second embodiments will be described.

Figure 9:
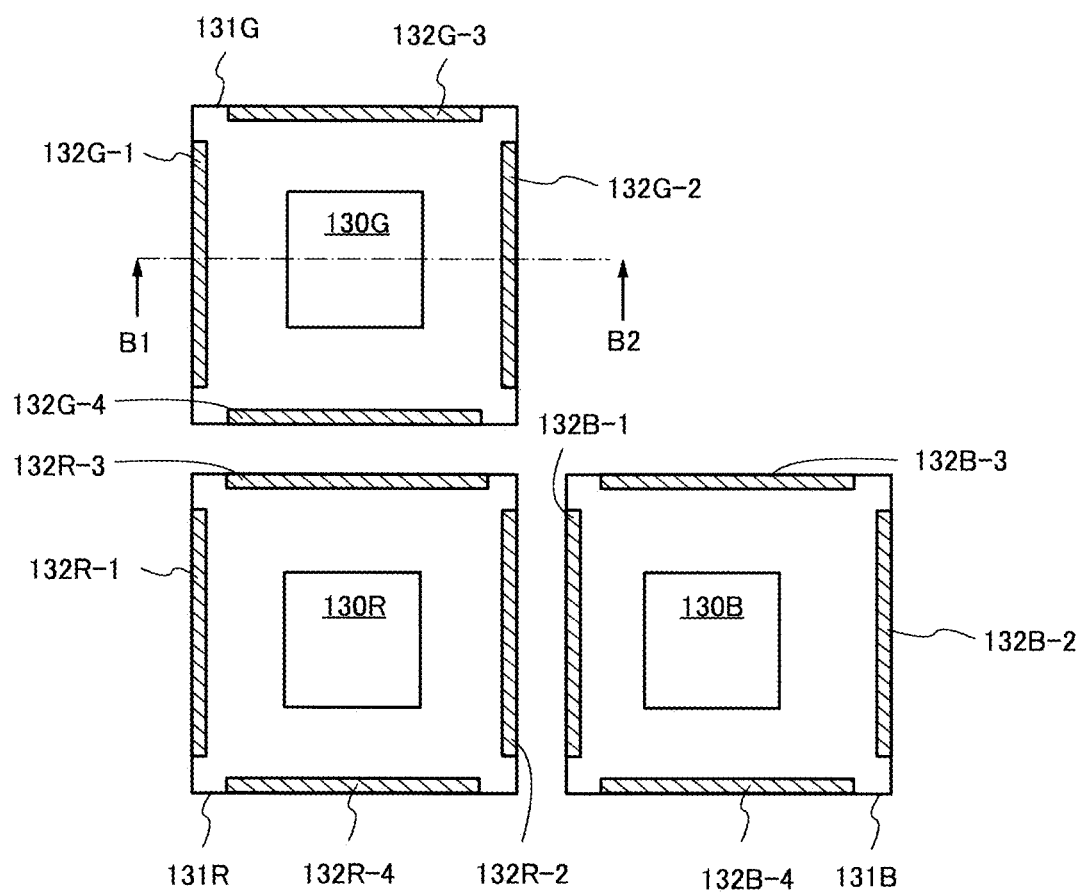
FIG. 9 is a diagram showing a plurality of pixels.
Figure 9:
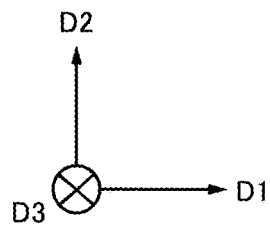
Figure 10:
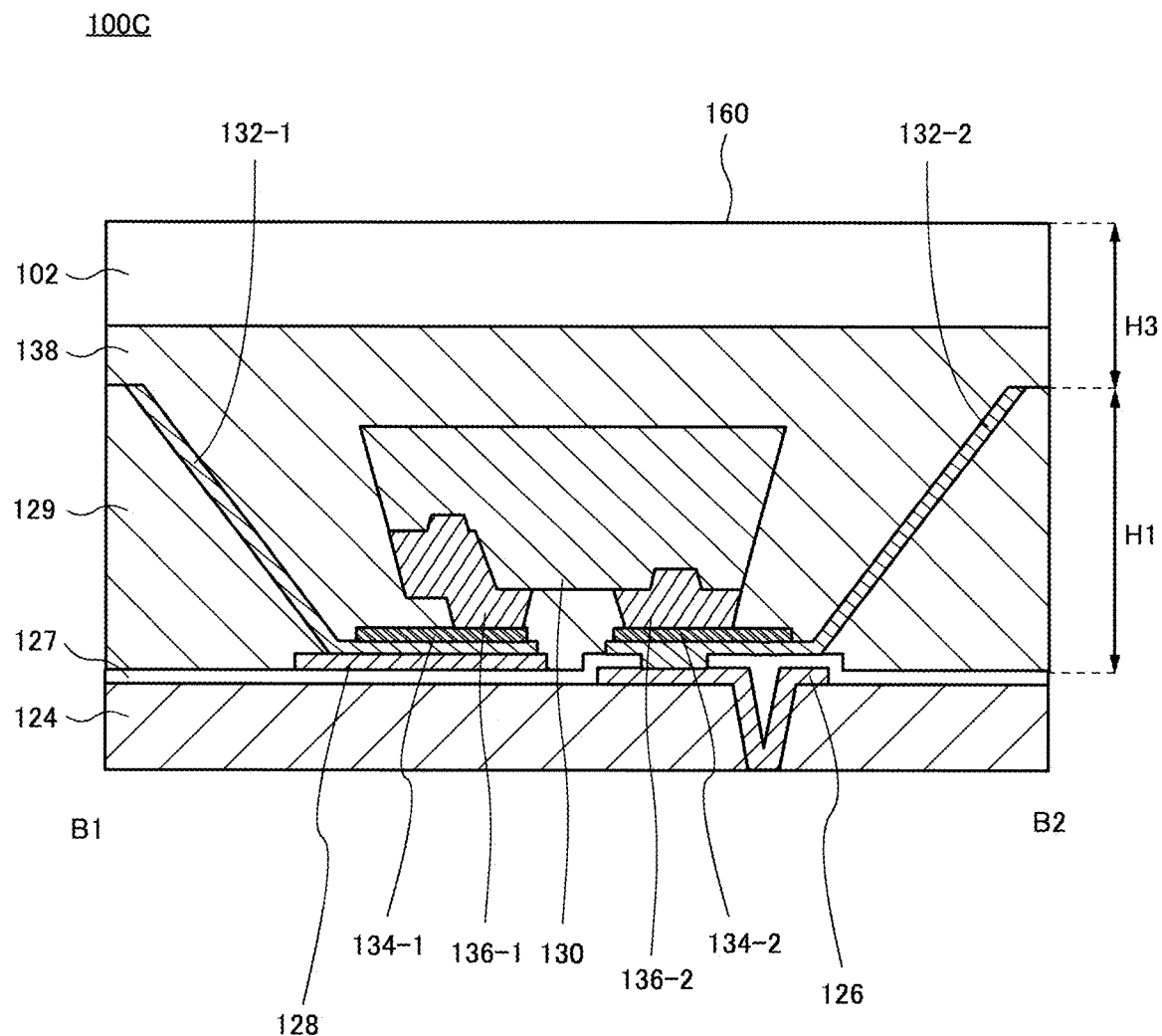
FIG. 10 is a cross-sectional view of a pixel shown in FIG. 9 taken along a line B1-B2.

FIG. 9 is a plan view showing the plurality of pixels 110 arranged in the display region 103 of a display device 100C. FIG. 10 is a cross-sectional view of the pixel 110 (pixel 110G) taken along a line B1-B2. In the present embodiment, the case where the reflective film 132 is divided for each inclined surface inside the opening 131 will be described.

As shown in FIG. 9, for example, in the pixel 110G, reflective films 132G-1, 132G-2, 132G-3, 132G-4 are provided for each inclined surface in the opening 131G. Also, in the pixel 110R, reflective films 132R-1, 132R-2, 132R-3, 132R-4 are provided for each inclined surface in the opening 131R. In the pixel 110B, reflective films 132B-1, 132B-2, 132B-3, 132B-4 are provided for each inclined surface of the opening 131.

In the present embodiment, each of the reflective films 132-1, 132-2, 132-3, 132-4 is electrically separated. Therefore, for example, as shown in FIG. 10, the reflective film 132-1 may be provided between the electrode 128 and the electrode 134-1 and may be electrically connected to the electrode 128 and the electrode 134-1. Similarly, the reflective film 132-2 may be provided between the electrode 126 and the electrode 134-2 and may be electrically connected to the electrode 126 and the electrode 134-2. In the case where ionic impurities enter from the exterior of the display device 100 and enter the planarization film 138, ions can be trapped by the reflective film when a potential is applied to the reflective film from the electrode. In addition, in the case where aluminum is used as the reflective film, it is preferable because aluminum is less likely to be anodized by applying a relatively low potential to the reflective film.

Furthermore, in the present embodiment, although the case where the reflective film 132-1 is electrically connected to the electrode 128 and the electrode 134-1 and the reflective film 132-2 is electrically connected to the electrode 126 and the electrode 134-2 has been described, the present invention is not limited to this structure. The reflective film 132-1 may be electrically insulated from the electrode 128 and the electrode 134-1, and the reflective film 132-2 may be electrically insulated from the electrode 126 and the electrode 134-2.

The height H3 from the upper end 129-1a of the opening 131 to the interface 160 with the air is preferably 20 µm or less also in the pixel structure shown in the present embodiment. Therefore, it is possible to improve the luminous efficiency and brightness of the display device 100 because the light emitted from the LED chip 130 can be suppressed from being lost by the total reflection. In addition, the angle θ of the inclined surfaces 129-1, 129-2 of the planarization film 129 is preferably 15° or more and 50° or less. As a result, when the angles θ of the inclined surfaces 129-1, 129-2 of the planarization film 129 are within the range described above, the luminous efficiency and brightness can be further improved.

Fourth Embodiment

In the present embodiment, a display device 100D having a partially different structure from the first to third embodiments will be described with reference to FIG. 11.

Figure 11:
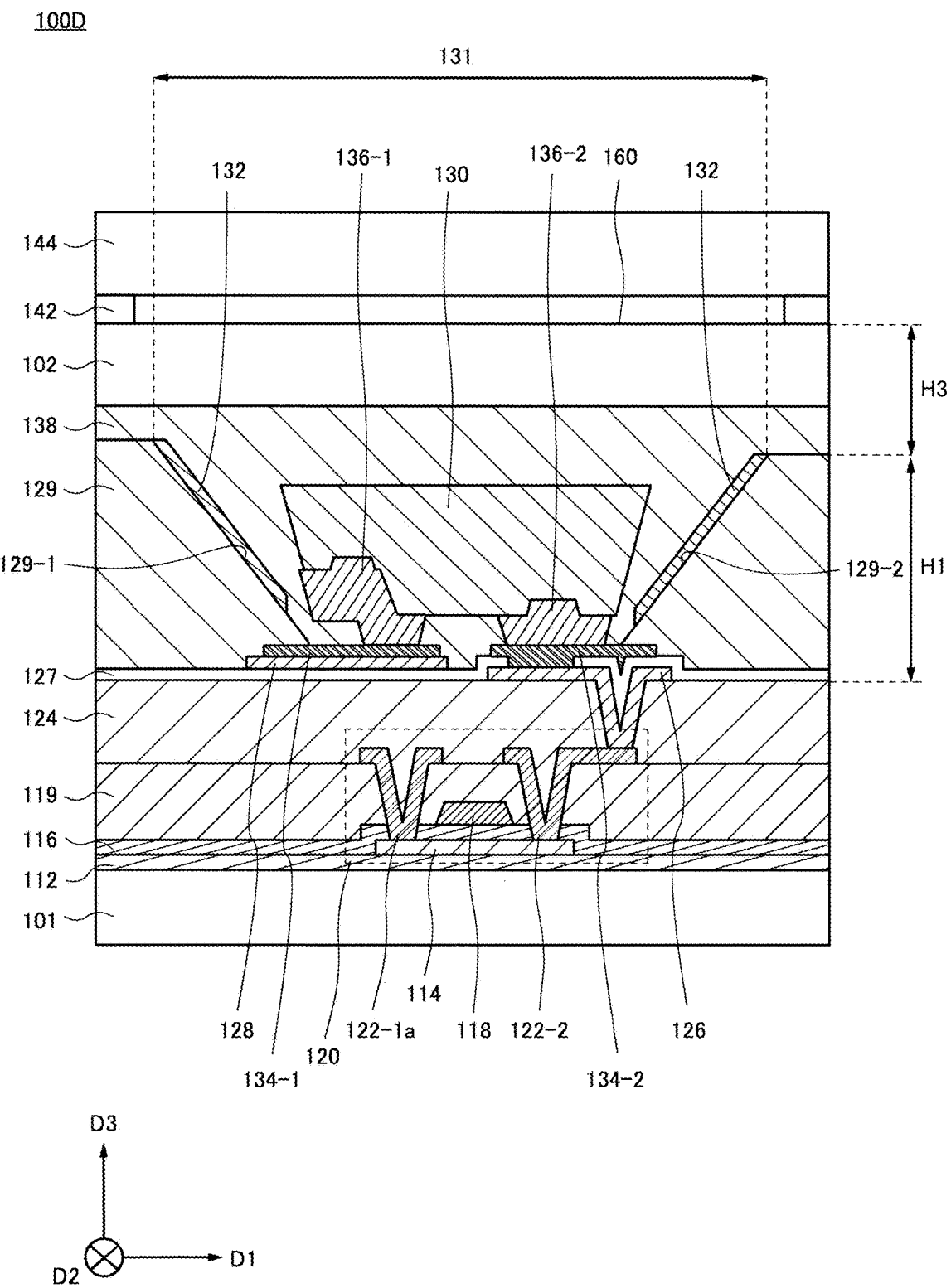
FIG. 11 is a cross-sectional view of a pixel structure of a display device according to one embodiment of the present application.

FIG. 11 is a cross-sectional view showing a pixel structure of the display device 100D according to one embodiment of the present invention. Also, the pixel structure is the same as the pixel structure shown in FIG. 3. In the present embodiment, a substrate 144 is provided on the substrate 102 via an adhesive layer 142. A thickness of the adhesive layer 142 is, for example, 3 µm to 10 µm. The substrate 144 is, for example, a glass substrate. An air layer is provided between the substrate 102 and the substrate 144. The physical strength can be improved by providing the thick film substrate 144 (e.g., glass) on the substrate 102.

The height H3 from the upper end 129-1a of the opening 131 to the interface with the air 160 is also reduced in the display device 100D. Specifically, the height H3 from the upper end 129-1a of the opening 131 to the interface 160 with the air is set to 20 µm or less. In FIG. 11, the height H3 of the interface 160 with the air from the upper end 129-1a of the opening 131 is the height from the upper end (surface) of the inclined surface in the planarization film 129 to the surface of the substrate 102.

EXAMPLES

In the present example, a result obtained by simulating the luminous efficiency in the pixel structure in the display device according to one embodiment of the present invention will be described.

(Simulation Conditions)

Figure 12:
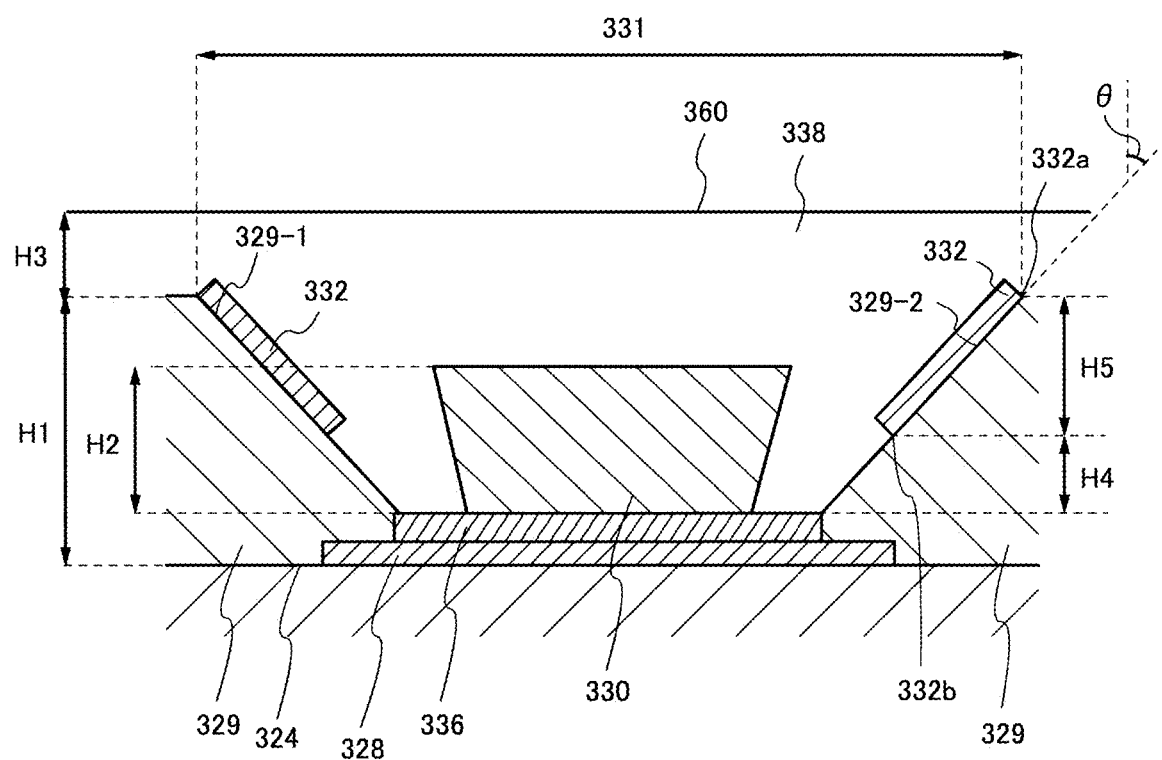
FIG. 12 is a cross-sectional view of a pixel structure used in a simulation.
Figure 12:
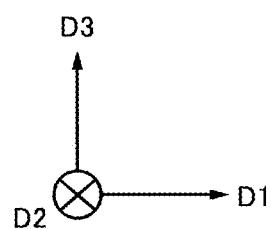

FIG. 12 is a cross-sectional view showing the pixel structure used in the simulation in the present example. An electrode 328 and an electrode 336 are arranged on an insulating surface 324 and an LED chip 330 is arranged on the electrode 336. Inclined surfaces 329-1, 329-2 of a planarization film 329 are arranged so as to surround the LED chip 330, and a reflective film 332 is arranged on the inclined surfaces 329-1, 329-2 inside the planarization film 329. An interface 360 with air was set on the planarization film 329 as an interface between the glass and the air.

Aluminum was set as the electrode 328, and tin was set as the electrode 336 shown in FIG. 12. A gallium nitride (GaN) based LED was set as the LED chip 330. In addition, a length of one side in the upper surface of an opening 331 was set to 45 µm, and a length L2 of one side in the upper surface of the LED chip 130 was set to 20 µm.

In this case, the thickness H1 of the planarization film 329, the height H3 of the interface 360 with air from the surface of a planarization film 338, the height H4 from the bottom surface of the LED chip 330 to a bottom end 332b of the reflective film 332, and the height H5 from the bottom end 332b of the reflective film 332 to an upper end 332a were set. At this time, the angle formed by the inclined surface 329-1 of the planarization film 329 and the third direction D3 was set as 9.

(Simulation Method)

The shape of the opening 331 was a regular truncated square pyramid shape, and a length of one side at the surface of the planarization film 329 was set to 45 µm. In addition, a length of one side of the LED chip 330 was set to 30 µm, and the height H2 of the LED chip 330 was set to 3 µm. In addition, the material of the electrode 328 was approximated by the material of aluminum, and the material of the electrode 336 was approximated by the material of tin. The total thickness obtained by combining the thickness of the electrode 328 and the thickness of the electrode 336 was set to 5 µm.

Calculations were made based on the conditions shown in Examples 1 and 2 and Comparative Examples 1 and 2 described below.

Example 1

In the pixel structure shown in FIG. 12, the height H5 was set to 7.5 µm, and a height (height H1+H3) obtained by adding the thickness of the planarization film 329 and the thickness of the glass was set to 20 µm (condition 1). In Condition 1, the relationship between the height H4 and angle θ was calculated. The heights H4 were 0 µm, 2.5 µm, 5.0 µm, 7.5 µm, 10 µm, and 12.5 µm, and the angles θ were 10°, 15°, 20°, 25°, 30°, 35°, 40°, 45°, 50°, and 55°.

Comparative Example 1

In the pixel structure shown in FIG. 12, the height H5 was set to 7.5 µm, and the height (height H1+H3) obtained by adding the thickness of the planarization film 329 and the thickness of the glass was set to 90 µm (Condition 2). In Condition 2, the relationship between the height H4 and angle θ was calculated. The heights H4 were 0 µm, 2.5 µm, 5.0 µm, 7.5 µm, 10 µm, and 12.5 µm, and the angles θ were 10°, 15°, 20°, 25°, 30°, 35°, 40°, 45°, 50°, and 55°.

Example 2

In the pixel structure shown in FIG. 12, the height H5 was set to 10.0 µm, and the height (heights H1+H3) obtained by adding the thickness of the planarization film 329 and the height H1 of the glass was set to 20 µm (Condition 3). In Condition 3, the relationship between the height H4 and angle θ was calculated. The heights H4 were 0 µm, 2.5 µm, 5.0 µm, 7.5 µm, and 10 µm, and the angles θ were 10°, 15°, 20°, 25°, 30°, 35°, 40°, 45°, and 50°.

Comparative Example 2

In the pixel structure shown in FIG. 12, the height H5 was set to 7.5 µm, and the height (height H1+H3) obtained by adding the thickness of the planarization film 329 and the height H1 of the glass was set to 90 µm (Condition 4). In Condition 4, the relationship between the height H4 and angle θ was calculated. The heights H4 were 0 µm, 2.5 µm, 5.0 µm, 7.5 µm, and 10 µm, and the angles θ were 10°, 15°, 20°, 25, 30°, 35°, 40°, 45°, and 50°.

(Result)

Calculation results of the luminous efficiency in Examples 1 and 2 and Comparative Examples 1 and 2 are shown in Tables 1 to 4. Table 1 shows calculation results of the luminous efficiency in Example 1. Table 2 shows calculation results of the luminous efficiency in Comparative Example 1. Table 3 shows calculation results of the luminous efficiency in Example 2. Table 4 shows calculation results of the luminous efficiency in Comparative Example 2.

TABLE 1

| | | Cavity position H4 [µm] | | | | | |
|---|---|---|---|---|---|---|---|
| | | 0.0 | 2.5 | 5.0 | 7.5 | 10.0 | 12.5 |
| Side wall angle [°] | 10 | 0.3230 | 0.3356 | 0.3564 | 0.3751 | 0.3860 | 0.3882 |
| | 15 | 0.3403 | 0.3700 | 0.3980 | 0.4149 | 0.4155 | 0.4043 |
| | 20 | 0.3687 | 0.4063 | 0.4298 | 0.4335 | 0.4202 | 0.4012 |
| | 25 | 0.3940 | 0.4263 | 0.4384 | 0.4314 | 0.4138 | 0.3947 |
| | 30 | 0.4114 | 0.4293 | 0.4329 | 0.4190 | 0.3976 | 0.3777 |
| | 35 | 0.4230 | 0.4245 | 0.4211 | 0.4023 | 0.3806 | 0.3638 |
| | 40 | 0.4280 | 0.4145 | 0.4041 | 0.3819 | 0.3599 | 0.3412 |
| | 45 | 0.4296 | 0.3976 | 0.3796 | 0.3533 | 0.3296 | 0.3109 |
| | 50 | 0.4216 | 0.3734 | 0.3479 | 0.3217 | 0.3022 | 0.2917 |
| | 55 | 0.4201 | 0.3429 | 0.3105 | 0.2879 | 0.2754 | 0.2709 |

TABLE 2

| | | Cavity position H4 [µm] | | | | | |
|---|---|---|---|---|---|---|---|
| | | 0.0 | 2.5 | 5.0 | 7.5 | 10.0 | 12.5 |
| Side wall angle [°] | 10 | 0.3091 | 0.3207 | 0.3399 | 0.3590 | 0.3709 | 0.3745 |
| | 15 | 0.3261 | 0.3554 | 0.3837 | 0.4027 | 0.4058 | 0.3970 |
| | 20 | 0.3547 | 0.3927 | 0.4177 | 0.4235 | 0.4122 | 0.3942 |
| | 25 | 0.3793 | 0.4129 | 0.4265 | 0.4209 | 0.4034 | 0.3832 |
| | 30 | 0.3981 | 0.4167 | 0.4221 | 0.4097 | 0.3891 | 0.3692 |
| | 35 | 0.4101 | 0.4128 | 0.4109 | 0.3932 | 0.3713 | 0.3518 |
| | 40 | 0.4153 | 0.4030 | 0.3934 | 0.3709 | 0.3476 | 0.3281 |
| | 45 | 0.4168 | 0.3856 | 0.3680 | 0.3424 | 0.3191 | 0.3002 |
| | 50 | 0.4080 | 0.3608 | 0.3356 | 0.3086 | 0.2861 | 0.2692 |
| | 55 | 0.4046 | 0.3277 | 0.2943 | 0.2688 | 0.2501 | 0.2368 |

TABLE 3

| | | Cavity position H4 [µm] | | | | |
|---|---|---|---|---|---|---|
| | | 0.0 | 2.5 | 5.0 | 7.5 | 10.0 |
| Side wall angle [°] | 10 | 0.3567 | 0.3883 | 0.4189 | 0.3963 | 0.3660 |
| | 15 | 0.3930 | 0.4368 | 0.4683 | 0.4289 | 0.3852 |
| | 20 | 0.4364 | 0.4785 | 0.5064 | 0.4513 | 0.3946 |
| | 25 | 0.4717 | 0.5094 | 0.5362 | 0.4639 | 0.3957 |
| | 30 | 0.4799 | 0.5017 | 0.5232 | 0.4484 | 0.3827 |
| | 35 | 0.5005 | 0.5007 | 0.5131 | 0.4326 | 0.3700 |
| | 40 | 0.5082 | 0.4832 | 0.4885 | 0.4085 | 0.3536 |
| | 45 | 0.5072 | 0.4644 | 0.4637 | 0.3876 | 0.3403 |
| | 50 | 0.5467 | 0.4762 | 0.4611 | 0.3764 | 0.3278 |

TABLE 4

| | | Cavity position H4 [µm] | | | | |
|---|---|---|---|---|---|---|
| | | 0.0 | 2.5 | 5.0 | 7.5 | 10.0 |
| Side wall angle | 10 | 0.3208 | 0.3413 | 0.3664 | 0.3870 | 0.3974 |
| | 15 | 0.3561 | 0.3963 | 0.4266 | 0.4404 | 0.4350 |
| | 20 | 0.4019 | 0.4430 | 0.4627 | 0.4577 | 0.4363 |

TABLE 4-continued

| | | Cavity position H4 [μm] | | | | |
|---|---|---|---|---|---|---|
| | | 0.0 | 2.5 | 5.0 | 7.5 | 10.0 |
| [°] | 25 | 0.4320 | 0.4623 | 0.4671 | 0.4489 | 0.4215 |
| | 30 | 0.4518 | 0.4628 | 0.4560 | 0.4304 | 0.4011 |
| | 35 | 0.4652 | 0.4530 | 0.4360 | 0.4048 | 0.3751 |
| | 40 | 0.4685 | 0.4333 | 0.4049 | 0.3687 | 0.3382 |
| | 45 | 0.4622 | 0.4003 | 0.3598 | 0.3221 | 0.2930 |
| | 50 | 0.4490 | 0.3519 | 0.2973 | 0.2627 | 0.2388 |

In the results of Example 1, the lowest luminous efficiency was 0.2709 when the height H4 was 12.5 μm and the angle θ was 55°. The highest luminous efficiency was 0.4384 when the height H4 was 5.0 μm and the angle θ was 25°.

In the result of Comparative Example 1, the lowest luminous efficiency was 0.2368 when the height H4 was 12.5 μm and the angle θ was 55°. The highest luminous efficiency was 0.4265 when the height H4 was 5.0 μm and the angle θ was 25°.

According to the results of Table 1 and Table 2, the highest luminous efficiency in Example 1 was found to be improved by 3.0% as compared with the highest luminous efficiency in Comparative Example 1.

In the results of Example 2, the lowest luminous efficiency was 0.3278 when the height H4 was 12.5 μm and the angle θ was 55°. The highest luminous efficiency was 0.4685 when the height H4 was 0 μm and the angle θ was 40°.

In the result of Comparative Example 2, the lowest luminous efficiency was 0.2388 when the height H4 was 12.5 μm and the angle θ was 55°. The highest luminous efficiency was 0.5467 when the height H4 was 5.0 μm and the angle θ was 0°.

According to the results of Table 3 and Table 4, the highest luminous efficiency in Example 2 was found to be improved by 18.0% as compared with the highest luminous efficiency in Comparative Example 2.

Further, the relationship between the height H3 (μm) and the upward radiation efficiency when the angle θ was set to 50°, the height H4 was set to 0 μm, and the height H5 was set to 10 μm was calculated. Table 5 shows the relationship between the height H3 and the upward radiation efficiency.

TABLE 5

| Height H3 (μm) | Upward radiation efficiency |
|---|---|
| 0.5 | 0.76 |
| 1 | 0.72 |
| 2 | 0.66 |
| 3 | 0.61 |
| 4 | 0.58 |
| 5 | 0.55 |
| 6 | 0.52 |
| 7 | 0.51 |
| 8 | 0.49 |
| 9 | 0.48 |
| 11 | 0.47 |
| 13 | 0.47 |
| 15 | 0.46 |
| 25 | 0.46 |
| 35 | 0.45 |
| 45 | 0.45 |
| 55 | 0.45 |
| 65 | 0.45 |
| 75 | 0.45 |

Figure 13:
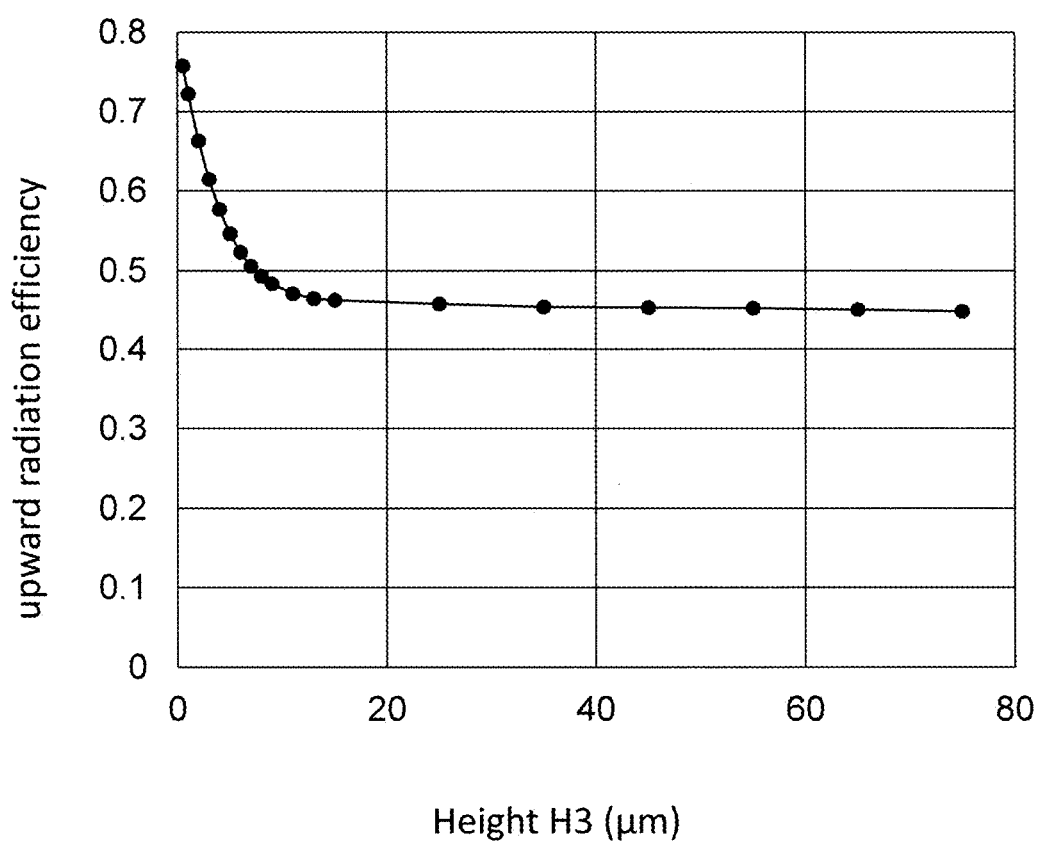
FIG. 13 is a graph showing the relationship between the thickness of a planarization film and the thickness of glass, and upward radiation efficiency.

FIG. 13 is a graph showing the relationship between the height H3 (μm) and the upward radiation efficiency. The horizontal axis represents the height H3 (μm), and the vertical axis represents the upward radiation efficiency. As shown in FIG. 13, in the case where the height H3 was 35 μm to 75 μm, the upward radiation efficiency remained at 0.45 and there was no change. When the height H3 is 15 μm to 25 μm, the upward radiation efficiency becomes 0.46. It was found that as the thickness became smaller than 25 μm, the upward radiation efficiency increased, and when the thickness became 0.5 μm, the upward radiation efficiency became 0.76, indicating the highest efficiency.

According to the results of the above calculations, it was shown that the upward radiation efficiency was improved when the height H3 was 25 μm or less.

The addition, deletion, or design change of components, or the addition, deletion, or condition change of process as appropriate by those skilled in the art based on the display device described as one embodiment and an example of the present invention are also included in the scope of the present invention as long as they are provided with the gist of the present invention. In addition, each of the embodiments described above can be combined with each other within a range that does not cause technical inconsistencies.

In addition, it is understood that, even if the effect is different from those provided by each of the above-described embodiments, the effect obvious from the description in the specification or easily predicted by persons ordinarily skilled in the art is apparently derived from the present invention.

It is understood that the effect corresponding to various modifications and variations easily predicted by persons ordinarily skilled in the art is also apparently derived from the present invention. For example, the addition, deletion, or design change of components, or the addition, deletion, or condition change of process as appropriate by those skilled in the art based on each embodiment are also included in the scope of the present invention as long as they are provided with the gist of the present invention.

What is claimed is:

1. A display device comprising:
   a first planarization film including an opening;
   a reflective film provided on an inclined surface inside the opening in the first planarization film;
   an LED chip surrounded by the reflective film and provided inside the opening; and
   a second planarization film provided on the first planarization film, surrounding the LED chip, and filling the opening,
   wherein a height from an upper end of the inclined surface of the first planarization film to an interface with air in the second planarization film is 20 μm or less.

2. The display device according to claim 1, wherein a bottom end of the reflective film is provided below a bottom end of the LED chip.

3. The display device according to claim 1, wherein a bottom end of the reflective film is provided above a bottom end of the LED chip.

4. The display device according to claim 3, wherein a height from the bottom end of the LED chip to the bottom end of the reflective film is 0 μm or more and 20 μm or less in a cross-sectional view.

5. The display device according to claim 1, wherein an upper end of the reflective film is approximately aligned with an upper end of the inclined surface.

6. The display device according to claim 1, wherein a height from the bottom end of the reflective film to an upper end of the reflective film is 5 μm or more and 40 μm or less in a cross-sectional view.

7. The display device according to claim 1, wherein an angle θ between the inclined surface and a direction perpendicular to a surface of the second planarization film is between 25° or more and 55° or less in a cross-sectional view.

8. The display device according to claim 1, wherein the reflective film is provided on the entirety of the inclined surface of the opening.

9. The display device according to claim 1, wherein the reflective film is divided into a plurality of pieces in the inclined surface inside the opening.

10. The display device according to claim 9, wherein one of the plurality of pieces of the divided reflective film is connected to a first electrode of the LED chip, and the other of the plurality of pieces of the divided reflective film is connected to a second electrode of the LED chip.

11. A display device comprising:
a first planarization film including an opening;
a reflective film provided on an inclined surface inside the opening in the first planarization film;
an LED chip surrounded by the reflective film and provided inside the opening;
a second planarization film provided on the first planarization film, surrounding the LED chip, and filling the opening; and
a substrate provided on the second planarization film,
wherein a height from an upper end of the inclined surface of the first planarization film to the interface between the substrate and air is 20 μm or less.

12. The display device according to claim 11, wherein a bottom end of the reflective film is provided below a bottom end of the LED chip.

13. The display device according to claim 11, wherein a bottom end of the reflective film is provided above a bottom end of the LED chip.

14. The display device according to claim 13, wherein a height from the bottom end of the LED chip to the bottom end of the reflective film is 0 μm or more and 20 μm or less in a cross-sectional view.

15. The display device according to claim 11, wherein an upper end of the reflective film is approximately aligned with an upper end of the inclined surface.

16. The display device according to claim 11, wherein a height from the bottom end of the reflective film to an upper end of the reflective film is 5 μm or more and 40 μm or less in a cross-sectional view.

17. The display device according to claim 11, wherein an angle θ between the inclined surface and a direction perpendicular to a surface of the second planarization film is between 25° or more and 55° or less in a cross-sectional view.

18. The display device according to claim 11, wherein the reflective film is provided on the entirety of the inclined surface of the opening.

19. The display device according to claim 11, wherein the reflective film is divided into a plurality of pieces in the inclined surface inside the opening.

20. The display device according to claim 19, wherein one of the plurality of pieces of the divided reflective film is connected to a first electrode of the LED chip, and the other of the plurality of pieces of the divided reflective film is connected to a second electrode of the LED chip.

* * * * *